(12) United States Patent
Bouche et al.

(10) Patent No.: US 9,093,557 B2
(45) Date of Patent: Jul. 28, 2015

(54) COMPLETING MIDDLE OF LINE INTEGRATION ALLOWING FOR SELF-ALIGNED CONTACTS

(71) Applicant: GLOBALFOUNDRIES Inc., Grand Cayman (KY)

(72) Inventors: Guillaume Bouche, Albany, NY (US); Haiting Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 13/961,318

(22) Filed: Aug. 7, 2013

(65) Prior Publication Data

US 2015/0041909 A1    Feb. 12, 2015

(51) Int. Cl.
*H01L 21/8238* (2006.01)
*H01L 27/092* (2006.01)

(52) U.S. Cl.
CPC .. *H01L 21/823828* (2013.01); *H01L 21/82385* (2013.01); *H01L 27/092* (2013.01); *H01L 21/823864* (2013.01)

(58) Field of Classification Search
CPC ................. H01L 29/66545; H01L 21/823828; H01L 29/6656; H01L 27/092

USPC .......................... 438/183, 184, 674, 926, 229
See application file for complete search history.

(56) References Cited

U.S. PATENT DOCUMENTS

| 4,912,061 A | 3/1990 | Nasr |
| 7,405,116 B2 * | 7/2008 | Carter et al. ................... 438/183 |
| 2007/0004123 A1 * | 1/2007 | Bohr et al. ..................... 438/230 |
| 2011/0281409 A1 * | 11/2011 | Ellis-Monaghan et al. .. 438/229 |
| 2012/0083121 A1 | 4/2012 | Ando et al. |

* cited by examiner

*Primary Examiner* — Whitney T Moore
(74) *Attorney, Agent, or Firm* — Williams Morgan, P.C.

(57) ABSTRACT

In general, aspects of the present invention relate to approaches for forming a semiconductor device such as a FET having complete middle of line integration. Specifically, a hard mask layer and set of spacers are removed from the gate stacks leaving behind (among other things) a set of dummy gates. A liner layer is formed over the set of dummy gates and over a source-drain region adjacent to the set of dummy gates. The liner layer is then removed from a top surface (or at least a portion thereof) of the set of dummy gates and the source-drain region. An inter-layer dielectric (ILD) is then deposited over the set of dummy gates and over the source-drain region, and the set of dummy gates are then removed. The result is an environment in which a self-aligned contact to the source-drain region can be deposited.

20 Claims, 6 Drawing Sheets

COMPLETING MIDDLE OF LINE INTEGRATION ALLOWING FOR SELF-ALIGNED CONTACTS

CROSS-REFERENCE TO RELATED APPLICATIONS

This patent application claims the benefit of co-pending U.S. patent application Ser. No. 13/738,270, filed on Jan. 10, 2013, which is hereby incorporated herein by reference.

BACKGROUND

1. Technical Field

This invention relates generally to the field of semiconductors and, more particularly, to approaches for removing gate height variances in devices such as field effect transistors (FETs).

2. Related Art

During fabrication, semiconductor devices such as FETs often include a stage in which a dummy gate is formed and later removed. Various layers such as hard mask layers, spacers, etc., may be formed over/around the dummy gates. In many cases, this leads to an uneven gate stack height among the gate stacks. Such a condition may then be propagated through the various stages of device formation that follow.

SUMMARY

In general, aspects of the present invention relate to approaches for forming a semiconductor device such as a FET having complete middle of line integration. Specifically, a hard mask layer and set of spacers are removed from the gate stacks leaving behind (among other things) a set of dummy gates. A liner layer is formed over the set of dummy gates and over a source-drain region adjacent to the set of dummy gates. The liner layer is then removed from a top surface (or at least a portion thereof) of the set of dummy gates and the source-drain region. An inter-layer dielectric (ILD) is then deposited over the set of dummy gates and over the source-drain region, and the set of dummy gates are then removed. The result is an environment in which a self-aligned contact to the source-drain region can be deposited.

A first aspect of the present invention provides a method for completing middle of line integration in a semiconductor device, comprising: removing a hard mask layer and a set of spacers from a set of dummy gates; depositing a liner layer over the set of dummy gates and over a source-drain region adjacent to the set of dummy gates; removing the liner layer from at least a portion of a top surface of the set of dummy gates and from at least a portion of a top surface of the source-drain region; depositing an inter-layer dielectric (ILD) over the set of dummy gates and over the source-drain region subsequent to the removing of the liner layer, and removing the set of dummy gates.

A second aspect of the present invention provides a method for completing middle of line integration in a semiconductor device, comprising: removing a hard mask layer and a set of spacers from a first gate stack and a second gate stack, the first gate stack having a first dummy gate, and the second gate stack having a second dummy gate; depositing a liner layer over the first dummy gate and the second dummy gate and over a source-drain region adjacent to the first dummy gate and the second dummy gate; removing the liner layer from at least a portion of a top surface of the first dummy gate and the second dummy gate and from at least a portion of a top surface of the source-drain region; and depositing an inter-layer dielectric (ILD) over the first dummy gate and over the second dummy gate and over the source-drain region subsequent to the removing of the liner layer, removing the first dummy gate and the second dummy gate, leaving a first recess and a second recess that are at least partially bounded by a remainder of the liner layer; depositing a first gate in a first recess and a second gate in the second recess; and depositing a set of contacts to the source-drain region, an alignment of the set of contacts having middle of line integration based on the remainder of the liner layer.

A third aspect of the present invention provides a method for completing middle of line integration in a semiconductor device, comprising: identifying a location for a self-aligned contact to a source-drain region adjacent to a first gate stack and a second gate stack of a semiconductor device, the first gate stack having a first dummy gate and the second gate stack having a second dummy gate; removing a hard mask layer and a set of spacers from the first gate stack and the second gate stack; depositing a liner layer over the first dummy gate and the second dummy gate and over the source-drain region; removing the liner layer from at least a portion of a top surface of the first dummy gate and the second dummy gate and from at least a portion of a top surface of the source-drain region; depositing an inter-layer dielectric (ILD) over the set of dummy gates and over the source-drain region subsequent to the removing of the liner layer, and removing the first dummy gate and the second dummy gate, leaving a first recess and a second recess that are at least partially bounded by a remainder of the liner layer; depositing a first gate in a first recess and a second gate in the second recess; and depositing a set of contacts to the source-drain region, an alignment of the set of contacts having middle of line integration based on the remainder of the liner layer.

BRIEF DESCRIPTION OF THE DRAWINGS

These and other features of this invention will be more readily understood from the following detailed description of the various aspects of the invention taken in conjunction with the accompanying drawings in which.

Figure 1:
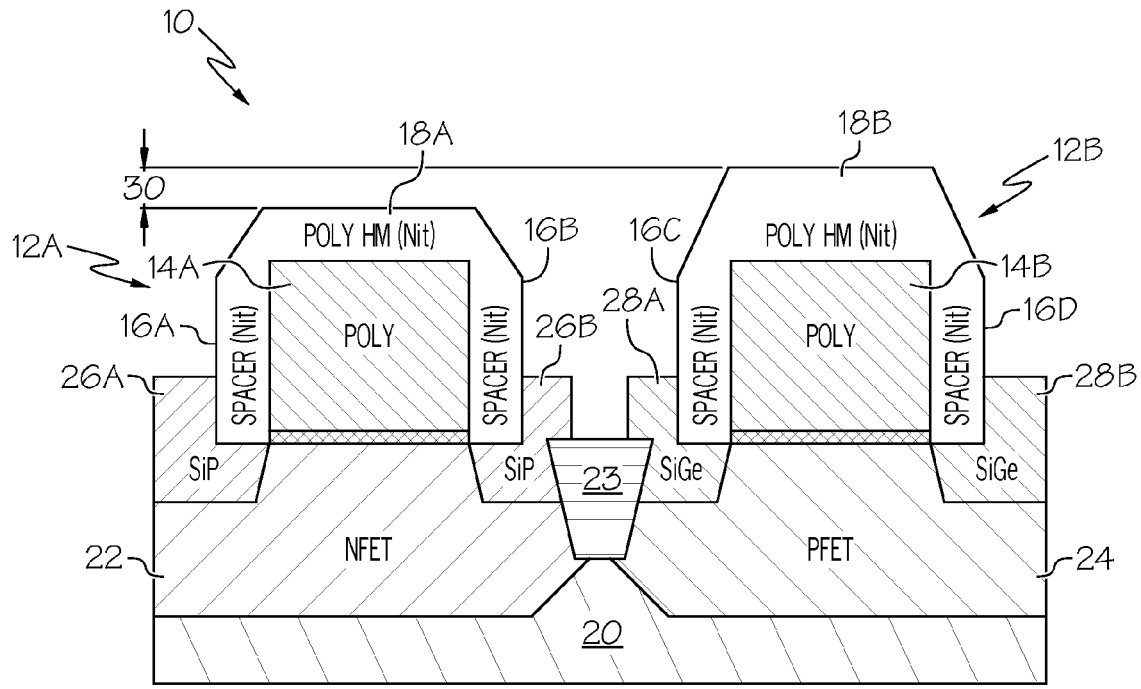
FIG. 1 shows a semiconductor device having a gate stack height variance according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, aspects of the present invention relate to approaches for forming a semiconductor device such as a FET having complete middle of line integration. Specifically, a hard mask layer and set of spacers are removed from the gate stacks leaving behind (among other things) a set of dummy gates. A liner layer is formed over the set of dummy gates and over a source-drain region adjacent to the set of dummy gates. The liner layer is then removed from a top surface (or at least a portion thereof) of the set of dummy gates and the source-drain region. An inter-layer dielectric (ILD) is then deposited over the set of dummy gates and over the source-drain region, and the set of dummy gates are then removed. The result is an environment in which a self-aligned contact to the source-drain region can be deposited.

Referring now to FIG. 1, a semiconductor device 10 according to an embodiment of the present invention is shown. As depicted, device 10 may include a set of gate stacks 12A-B formed over substrate 20. Gate stacks 12A-B may include dummy gates 14A-B (e.g., poly silicon, SiOC, SiOCN, and/or the like), spacers 16A-D and hard mask layers 18A-B (e.g., poly nitride). As further shown, device 10 may include NFET region 22, PFET region 24, isolation region 23, raised source-drain (RSDs) Phosporus Silicon (SiP) 26A-B, and silicon germanium (SiGe) regions 28A-B. It is understood that the labeling of portions of RSD in accordance with use of certain materials (e.g., SiP and SiGe) should not be seen as limiting, but rather, use of any materials now known or later developed as being adapted for use in RSDs is envisioned. It is understood that these layers/components are intended to be illustrative only and that other layers and/or materials may exist in device 10. Regardless, as shown, gate stacks 12A-B may have a height variance/differential 30. In the example shown, gate stack 12A is shorter than gate stack 12B.

Applicants have discovered that current solutions for correcting this height variance/differential may lead to a degradation of the spacers 16A-D, which will eventually be adjacent to the gate. This, combined with a slight misalignment of one or more contacts can lead to direct contact between the gate and the contact, which may lead to device performance issues.

Figure 2:
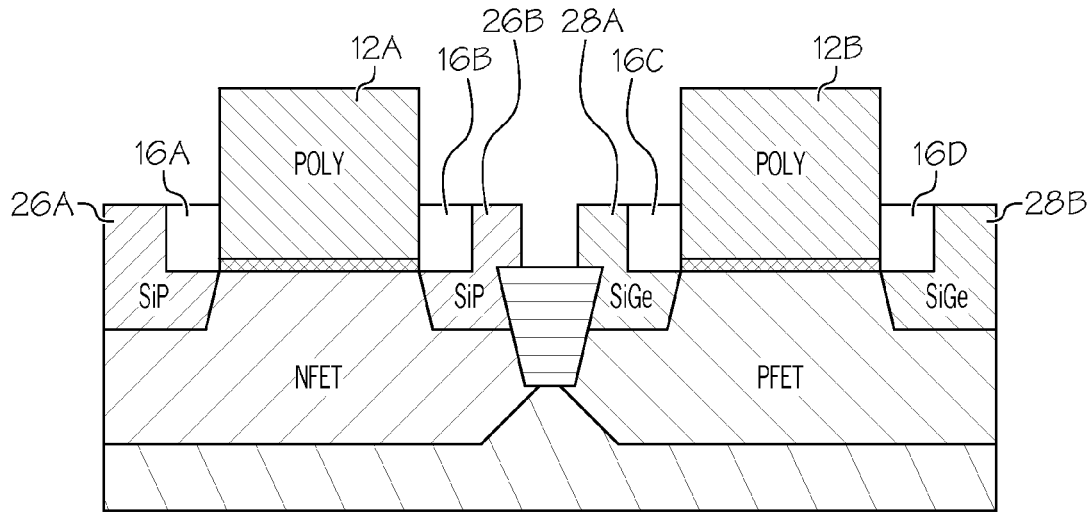
FIG. 2 shows a removal of a hard mask layer and spacers from the device of FIG. 1 according to an embodiment of the present invention.

To address the differential 30 in a manner that allows for complete middle of the line integration, a set of additional processing steps may be taken hereunder. Referring to FIG. 2, it is shown that the spacers 16A-D and hard mask layer 18A-B shown in FIG. 1 have been stripped from gate stacks 12A-B (remaining only within RSD SiP 26A-B and SiGe 28A-B regions). Note that this stripping of the spacers 16A-D such they are substantially even with RSD SiP 26A-B and SiGe 28A-B regions differs from prior art solutions that attempt to leave the spacers 16A-D when stripping the hard mask layer 18A-B, resulting in possible degradation of the spacers.

Figure 3:
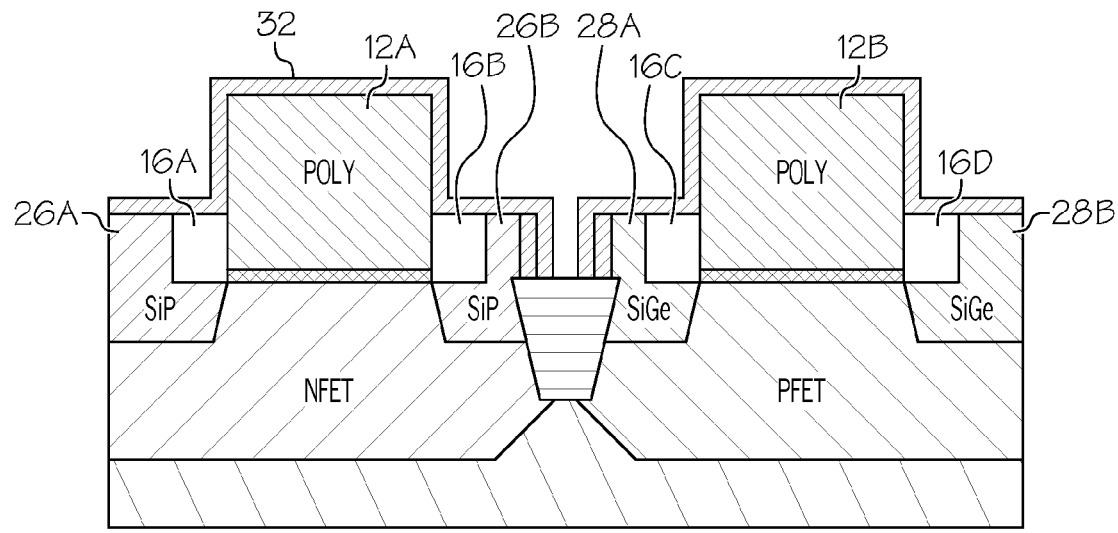
FIG. 3 shows a deposit of a liner layer to the device of FIG. 2 according to an embodiment of the present invention.

In any case, as shown in FIG. 3, a liner layer 32 (e.g., nitride) will then be deposited. Specifically, as shown, liner layer 32 is applied along the top surface and side surfaces of dummy gates 14A-D as well as along the top surfaces of: spacers 16A-D, RSD SiP regions 28A-B, and SiGe regions 28A-B. Liner layer 32 can include silicon nitride, SiOC, SiOCN, and or any material now known or later developed for forming such a liner layer 32. In an embodiment, liner layer 32 is conformal, e.g., forming a coating that conforms to the contours formed by the various components of semiconductor device 10.

Figure 4:
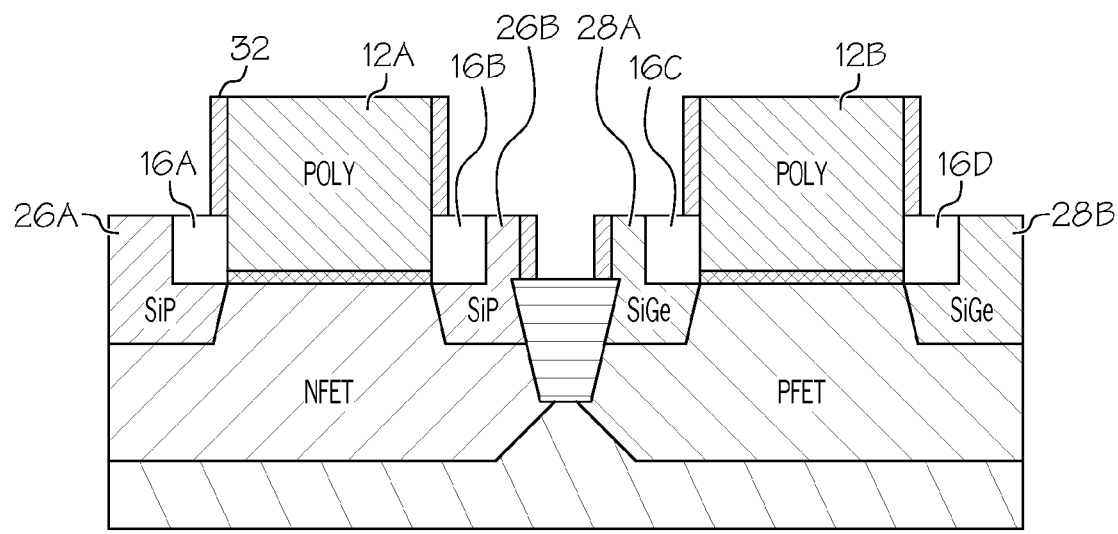
FIG. 4 shows partial removal of the liner layer from the device of FIG. 3 according to an embodiment of the present invention.

As shown in FIG. 4, liner layer 32 is then removed from top surfaces 36A-B of dummy gates 14A-B (e.g., by reactive ion etch (RIE)). In addition, liner layer 32 is also removed from the top surfaces of RSD SiP 26A-B and SiGe 28A-B regions. Liner layer 32 may also be removed from the top surfaces of spacers 16A-D. However, liner layer 32 is allowed to remain along the side walls of dummy gates 14A-B.

Figure 5:
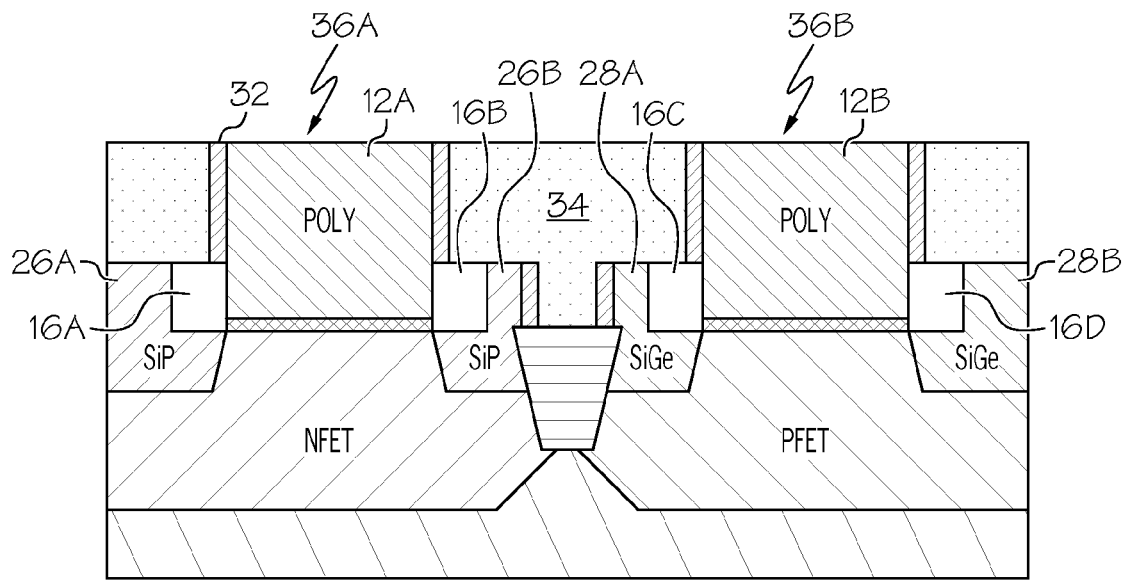
FIG. 5 shows a deposit of an inter-layer dielectric to the device of FIG. 4 according to an embodiment of the present invention.

As shown in FIG. 5, ILD 34 is then deposited over the liner layer 32 and polished (e.g., via chemical-mechanical polishing (CMP)). Note that this depositing of the ILD is performed subsequent to removal of liner layer from top surfaces 36A-B of dummy gates 14A-B and from top surfaces of RSD SiP 26A-B and SiGe 28A-B regions. Accordingly, not only are dummy gates 14A-B able to be removed without having to perform the additional step of removing the liner layer from the top surfaces 36A-B of dummy gates 14A-B, but RSD SiP 26A-B and SiGe 28A-B regions can be accessed without having to perform the additional step of removing the liner layer from the top surfaces of RSD SiP 26A-B and SiGe 28A-B regions.

Figure 6:
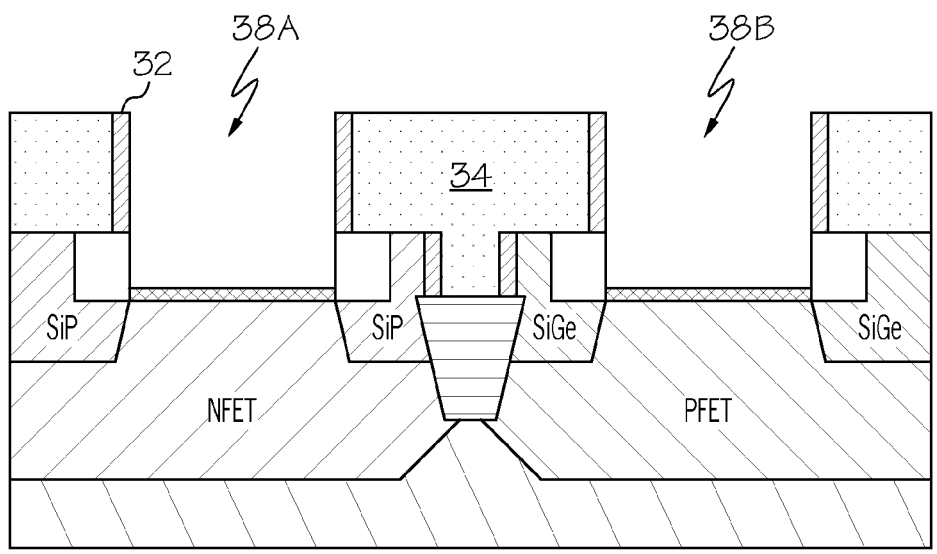
FIG. 6 shows removal of the dummy gates from the gate stacks of the device of FIG. 5 according to an embodiment of the present invention.

Then, as shown in FIG. 6, the dummy gates (14A-B) can be removed leaving the remainder of liner layer 32 and ILD 34 forming gate region/areas 38A-B (hereafter "recess"). As shown, gate areas 38A-B no longer have the height differential 30 shown in FIG. 1. Further, the forming gate region/areas 38A-B are bounded by the remainder of the liner layer 32, which also has a substantially uniform height. Accordingly, subsequent placement of contacts to RSD SiP 26A-B and SiGe 28A-B regions can be done without concern that misalignment may lead to performance issues due to the contacts contacting the gate dues to gaps in the liner layer 32 caused by height differentials in the remainder portions of the liner layer.

Figure 7:
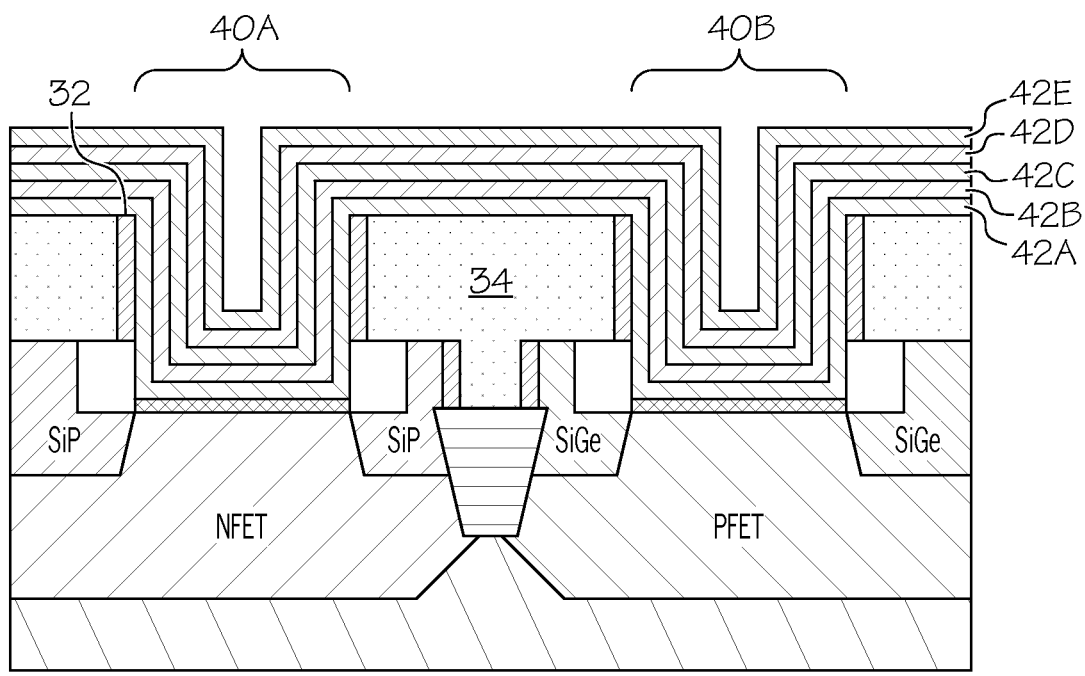
FIG. 7 shows a deposit of a gate to the device of FIG. 6 according to an embodiment of the present invention.

Then, as shown in FIG. 7, the gates (40A-B) can be formed in forming gate region/areas 38A-B. As shown, gates 40A-B can be formed by depositing a set of gate material layers 42A-E. Such a set of gate materials 42A-E can include an oxide stack 42A, including, but not limited to Hafnium Oxide, covered by one or more work-function metal layers 42B-E, which can include, but not be limited to: Ti, TiN, Ta, TaN, TiAl, Al, TiC, W, and/or the like. Additionally or in the alternative, any other solution now known or later discovered. In any event, the portion of the gates 40A-B within forming gate region/areas 38A-B are bounded by the remainder of the liner layer 32.

Figure 8:
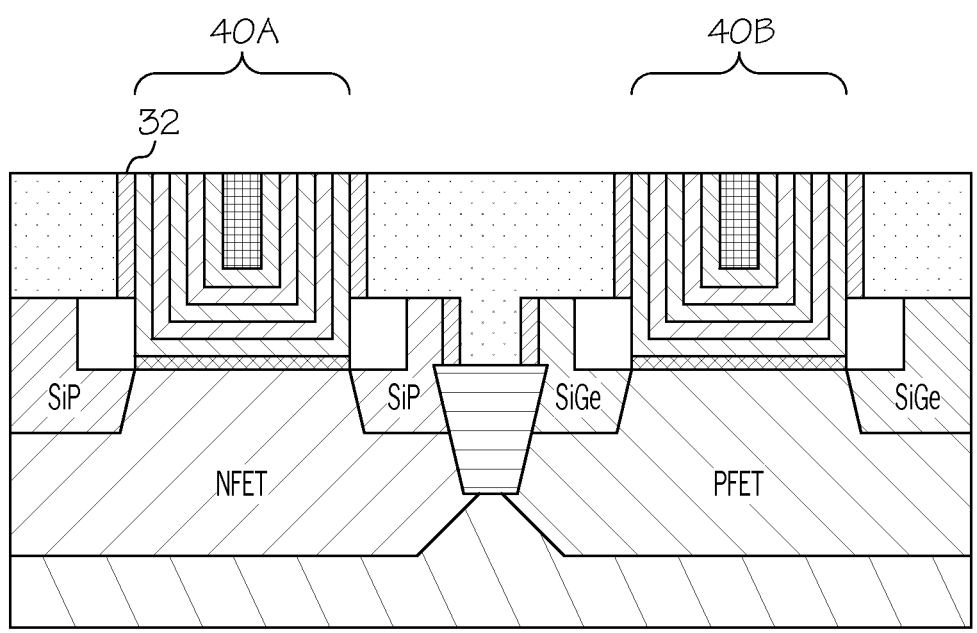
FIG. 8 shows removal of excess gate material to the device of FIG. 7 according to an embodiment of the present invention.
Figure 9:
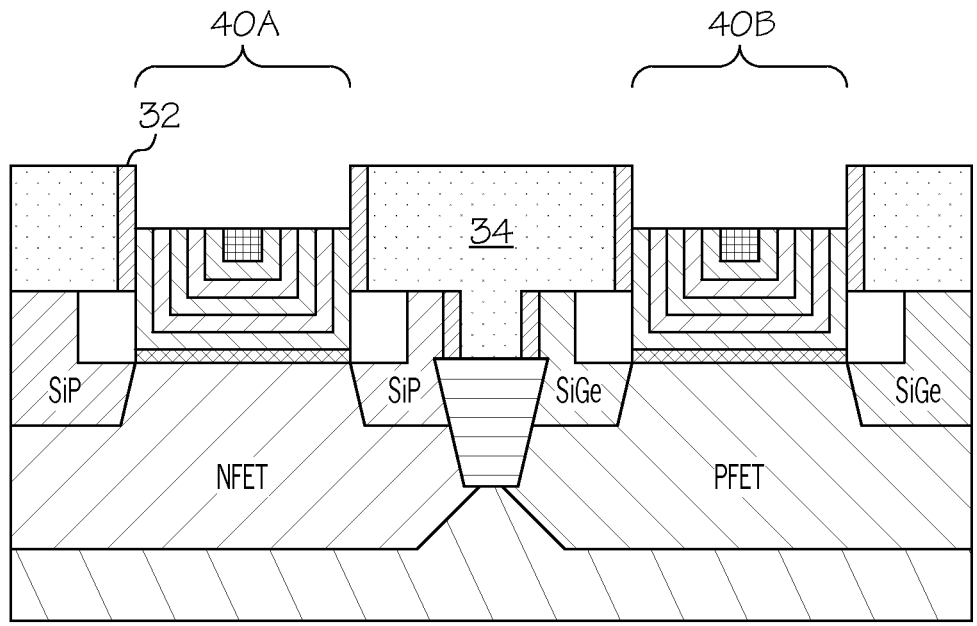
FIG. 9 shows a recessing of a gate to the device of FIG. 8 according to an embodiment of the present invention.
Figure 10:
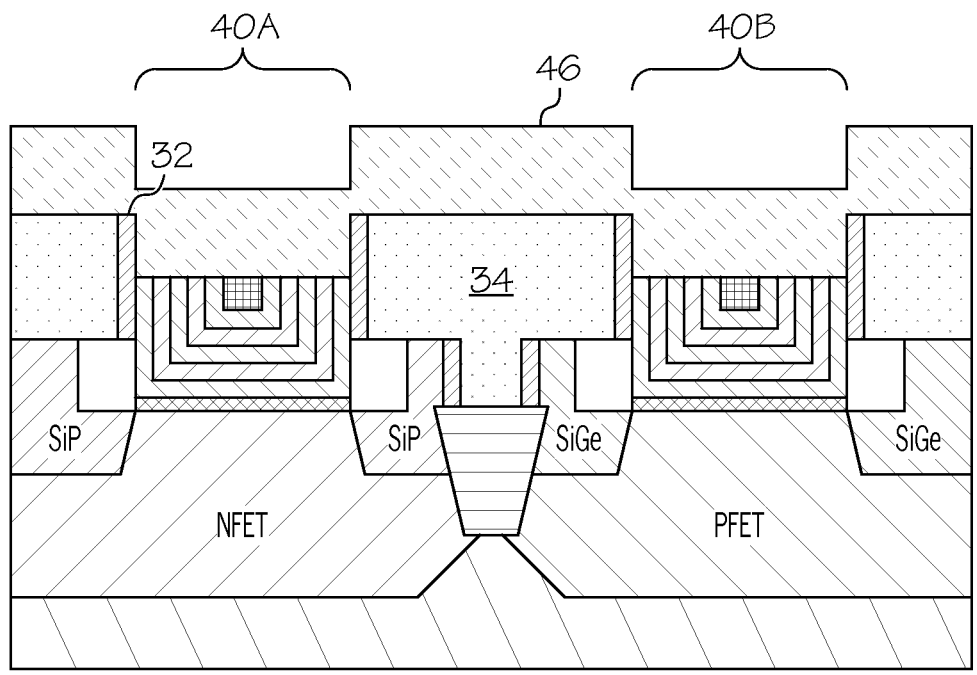
FIG. 10 shows a deposit of a cap to the device of FIG. 9 according to an embodiment of the present invention.
Figure 11:
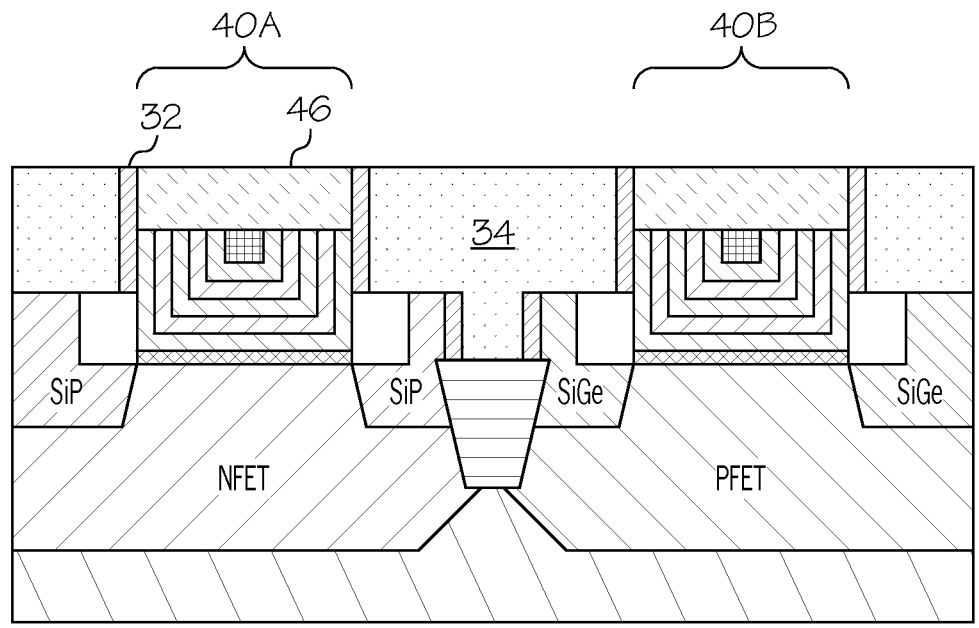
FIG. 11 shows a clearing of excess nitride to the device of FIG. 10 according to an embodiment of the present invention.

As shown in FIG. 8, any material that forms the gates 40A-B can then be removed, if necessary, from the remainder of liner layer 32 and ILD 34 top surfaces 36A-B of dummy gates 14A-B (e.g., by reactive ion etch (RIE), CMP, etc.). As shown in FIG. 9, the metal forming gates 40A-B can be recessed, e.g., with an etch, such that the top of gates 40A-B is below the upper limit of the remainder of the liner layer 32. Then, as shown in FIG. 10, gate can be covered with a cap 46 (e.g., a nitride plug), such as by depositing a blanket nitride film, and, as shown in FIG. 11, excessive nitride can be cleared from over the field (e.g., by CMP).

Figure 12:
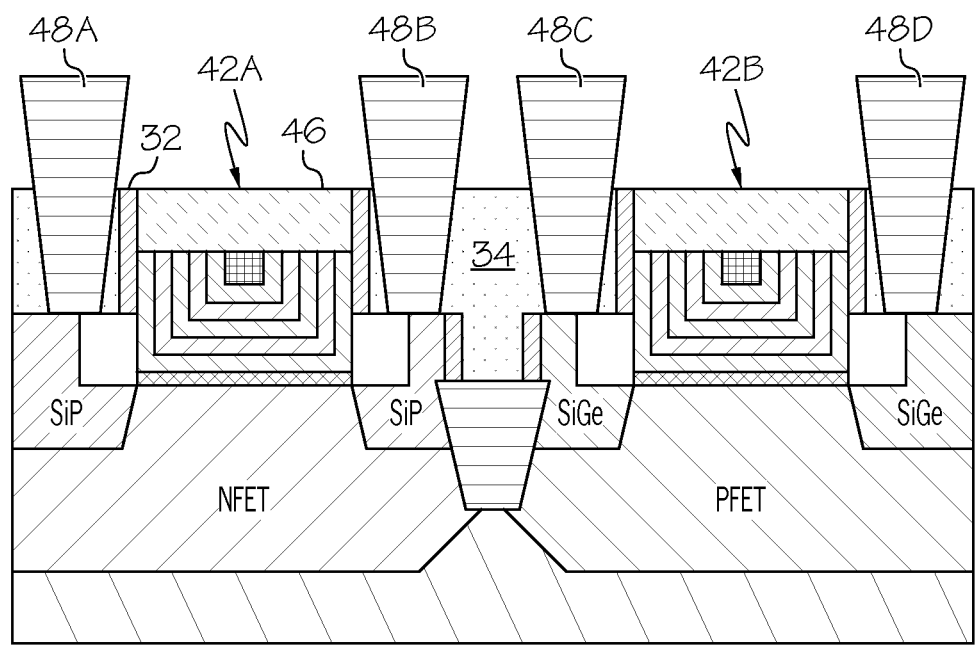
FIG. 12 shows a deposit of a contact to the device of FIG. 8 according to an embodiment of the present invention.

Then, as shown in FIG. 12, a set of contacts (48A-D) can be formed to contact RSD SiP 26A-B and SiGe 28A-B regions. Contacts 48A-D can be formed using a TS contact etch. TS etch can be oxide only, resulting in an etch that is selective to nitride. As cap 46 and remainder of liner layer 32 is nitride, the etch will not impact these structures. Further, the uniform height of the remainder of the liner layer 32 leads to a gapless seal between the remainder of the liner layer 32 and the cap 46. Accordingly, an accidental misalignment of the litho used to perform the TS etch will not result in a contact-gate short. This for allows an aspect ratio for the TS etch, silicide and contact 48A-D fill that is more forgiving than could be achieved with prior art solutions.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for completing middle of line integration in a semiconductor device, comprising:
   removing a hard mask layer and a set of spacers from a set of dummy gates;
   depositing a liner layer over the set of dummy gates and over a source-drain region adjacent to the set of dummy gates subsequent to removing the hard mask layer and set of spacers;
   removing the liner layer from at least a portion of a top surface of the set of dummy gates and from at least a portion of a top surface of the source-drain region;
   depositing an inter-layer dielectric (ILD) over the set of dummy gates and over the source-drain region subsequent to the removing of the liner layer, and
   removing the set of dummy gates.

2. The method of claim 1, further comprising forming a replacement metal gate transistor.

3. The method of claim 2, further comprising:
   forming a NFET region over a substrate; and
   forming a PFET region over the substrate.

4. The method of claim 3, further comprising:
   forming a set of phosphorus-doped Si (SiP) regions of a raised source-drain (RSD) in the NFET region; and
   forming a set of silicon germanium (SiGe) regions of the RSD in the PFET region.

5. The method of claim 1, the set of dummy gates comprising at least one of: poly silicon, SiOC or SiOCN.

6. The method of claim 1, the liner layer comprising at least one of: a silicon nitride, SiOC or SiOCN.

7. The method of claim 1, further comprising polishing the ILD.

8. The method of claim 1, the liner layer being removed via polishing or etching.

9. The method of claim 1, further comprising a semiconductor device formed according to the method of claim 1.

10. A method for completing middle of line integration in a semiconductor device, comprising:
   removing a hard mask layer and a set of spacers from a first gate stack and a second gate stack, the first gate stack having a first dummy gate, and the second gate stack having a second dummy gate;
   depositing a liner layer over the first dummy gate and the second dummy gate and over a source-drain region adjacent to the first dummy gate and the second dummy gate subsequent to removing the hard mask layer and set of spacers;
   removing the liner layer from at least a portion of a top surface of the first dummy gate and the second dummy gate and from at least a portion of a top surface of the source-drain region; and
   depositing an inter-layer dielectric (ILD) over the first dummy gate and over the second dummy gate and over the source-drain region subsequent to the removing of the liner layer,
   removing the first dummy gate and the second dummy gate, leaving a first recess and a second recess that are at least partially bounded by a remainder of the liner layer;
   depositing a first gate in a first recess and a second gate in the second recess; and
   depositing a set of contacts to the source-drain region, an alignment of the set of contacts having middle of line integration based on the remainder of the liner layer.

11. The method of claim 10, further comprising forming a replacement metal gate transistor.

12. The method of claim 11, the transistor comprising:
   forming a NFET region over a substrate; and
   forming a PFET region over the substrate.

13. The method of claim 12, further comprising:
   forming a set of phosphorus-doped Si (SiP) regions of a raised source-drain (RSD) in the NFET region; and
   forming a set of silicon germanium (SiGe) regions of the RSD in the PFET region.

14. The method of claim 10, the set of dummy gates comprising at least one of: poly silicon, SiOC or SiOCN.

15. The method of claim 10, the liner layer comprising at least one of: a silicon nitride, SiOC or SiOCN.

16. The method of claim 10, further comprising polishing the ILD.

17. The method of claim 10, the liner layer being removed via polishing or etching.

18. The method of claim 10, further comprising a semiconductor device formed according to the method of claim 1.

19. A method for completing middle of line integration in a semiconductor device, comprising:
   identifying a location for a self-aligned contact to a source-drain region adjacent to a first gate stack and a second gate stack of a semiconductor device, the first gate stack having a first dummy gate and the second gate stack having a second dummy gate;
   removing a hard mask layer and a set of spacers from the first gate stack and the second gate stack;
   depositing a liner layer over the first dummy gate and the second dummy gate and over the source-drain region subsequent to removing the hard mask layer and set of spacers;
   removing the liner layer from at least a portion of a top surface of the first dummy gate and the second dummy gate and from at least a portion of a top surface of the source-drain region;
   depositing an inter-layer dielectric (ILD) over the set of dummy gates and over the source-drain region subsequent to the removing of the liner layer, and
   removing the first dummy gate and the second dummy gate, leaving a first recess and a second recess that are at least partially bounded by a remainder of the liner layer;
   depositing a first gate in a first recess and a second gate in the second recess; and
   depositing a set of contacts to the source-drain region, an alignment of the set of contacts having middle of line integration based on the remainder of the liner layer.

20. The method of claim 19, further comprising a semiconductor device formed according to the method of claim 1.

* * * * *